United States Patent
Kajita et al.

(10) Patent No.: US 12,224,166 B2
(45) Date of Patent: Feb. 11, 2025

(54) MAGNESIUM OXIDE SPUTTERING TARGET

(71) Applicant: JX Nippon Mining & Metals Corporation, Tokyo (JP)

(72) Inventors: Hiroki Kajita, Ibaraki (JP); Yoshitaka Shibuya, Ibaraki (JP); Satoyasu Narita, Ibaraki (JP)

(73) Assignee: JX ADVANCED METALS CORPORATION, Tokyo (JP)

(*) Notice: Subject to any disclaimer, the term of this patent is extended or adjusted under 35 U.S.C. 154(b) by 394 days.

(21) Appl. No.: 17/284,003

(22) PCT Filed: Oct. 9, 2019

(86) PCT No.: PCT/JP2019/039801
§ 371 (c)(1),
(2) Date: Apr. 9, 2021

(87) PCT Pub. No.: WO2020/075750
PCT Pub. Date: Apr. 16, 2020

(65) Prior Publication Data
US 2021/0351023 A1 Nov. 11, 2021

(30) Foreign Application Priority Data

Oct. 10, 2018 (JP) .................. 2018-191474

(51) Int. Cl.
*H01J 37/34* (2006.01)
*C01F 5/02* (2006.01)
(Continued)

(52) U.S. Cl.
CPC ............ *H01J 37/3426* (2013.01); *C01F 5/02* (2013.01); *C23C 14/081* (2013.01);
(Continued)

(58) Field of Classification Search
CPC ..... H01J 37/3426; C01F 5/02; C01P 2002/60; C01P 2002/03; C01P 2002/61;
(Continued)

(56) References Cited

U.S. PATENT DOCUMENTS 8,454,933 B2  6/2013  Nagano et al.
9,824,868 B2  11/2017  Okamoto et al.
(Continued)

FOREIGN PATENT DOCUMENTS

JP     10130827 A  *  5/1998
JP     H10-130827 A    5/1998
(Continued)

OTHER PUBLICATIONS

Machine Translation JP 10-130827 (Year: 1998).*
(Continued)

*Primary Examiner* — Rodney G McDonald
(74) *Attorney, Agent, or Firm* — Howson & Howson LLP

(57) ABSTRACT

A sputtering target configured from a magnesium oxide sintered body, wherein a ratio of crystal grains of the magnesium oxide sintered body in which a number of pinholes in a single crystal grain is 20 or more is 50% or less. The present invention is a sputtering target configured from a magnesium oxide sintered body in which the generation of particles during sputtering is less.

3 Claims, 2 Drawing Sheets

10um

(51) Int. Cl.
*C23C 14/08* (2006.01)
*C23C 14/34* (2006.01)

(52) U.S. Cl.
CPC ...... *C23C 14/3407* (2013.01); *C01P 2002/60* (2013.01); *C01P 2004/03* (2013.01); *C01P 2004/61* (2013.01); *C01P 2006/80* (2013.01)

(58) Field of Classification Search
CPC ............... C01P 2002/80; C23C 14/081; C23C 14/3407; C23C 14/3414; C04B 35/04; C04B 35/053; C04B 35/645; C04B 35/6455; C04B 2235/5436; C04B 2235/5445; C04B 2235/6567; C04B 2235/661; C04B 2235/72; C04B 2235/77; C04B 2235/786; C04B 2235/81; C04B 2235/96
USPC ........................................ 204/298.12, 298.13
See application file for complete search history.

(56) References Cited

U.S. PATENT DOCUMENTS

| | | | |
|---|---|---|---|
| 9,988,709 | B2 | 6/2018 | Hisano et al. |
| 10,066,290 | B1 | 9/2018 | Disano et al. |
| 2010/0294657 | A1 | 11/2010 | Nagano et al. |
| 2020/0010368 | A1 | 1/2020 | Ivanov et al. |
| 2020/0263291 | A1 | 8/2020 | Shibuya et al. |
| 2021/0017085 | A1 | 1/2021 | Narita |

FOREIGN PATENT DOCUMENTS

| | | | | |
|---|---|---|---|---|
| JP | 2017-197812 | * | 11/2017 | |
| WO | WO-2018013387 A1 | * | 1/2018 | ........... C04B 35/053 |
| WO | 2019/177086 A1 | | 9/2019 | |

OTHER PUBLICATIONS

Machine Translation JP 2017-197812 (Year: 2017).*
Extended European Search Report issued in EP Patent Application No. 19871135.0 on Apr. 25, 2022.
K. Itatani et al., "Thermal and Optical Properties of Transparent Magnesium Oxide Ceramics Fabricated by Post Hot-Isostatic Pressing", Journal of European Ceramic Society, vol. 26, No. 4-5, pp. 639-645, Jan. 2006.

* cited by examiner

[Fig. 1]
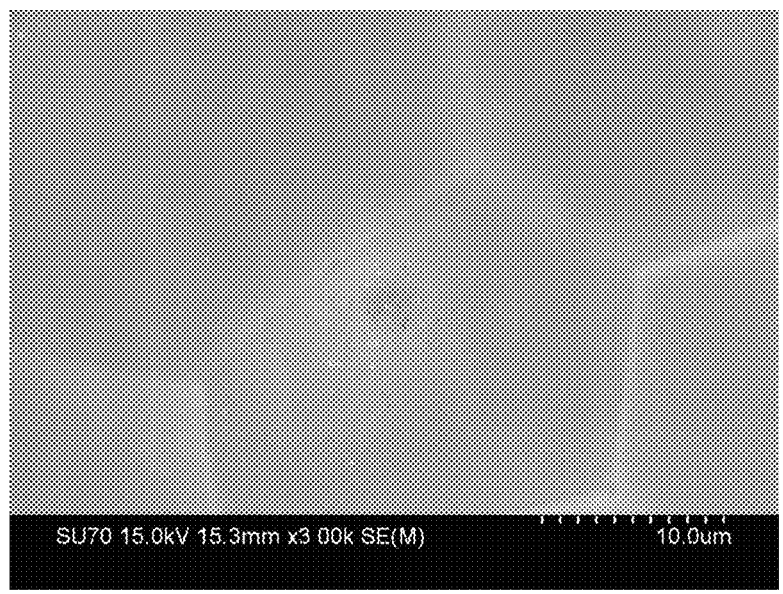
[Fig. 2]
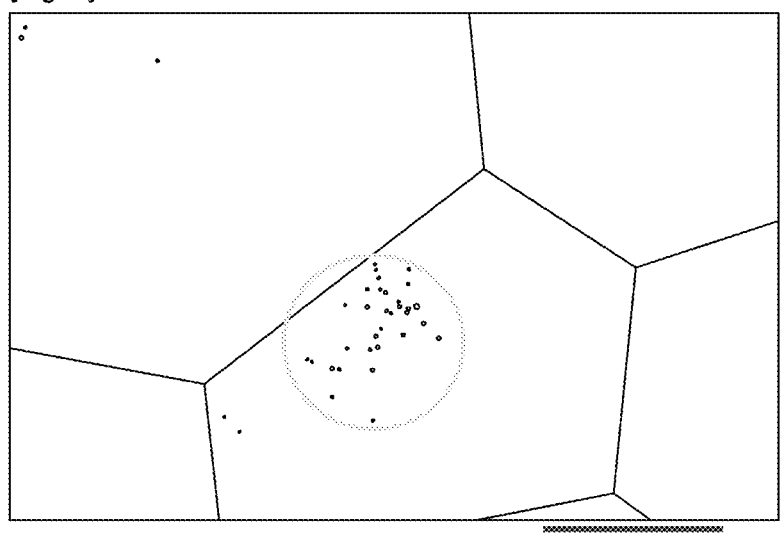
10um

[Fig. 3]
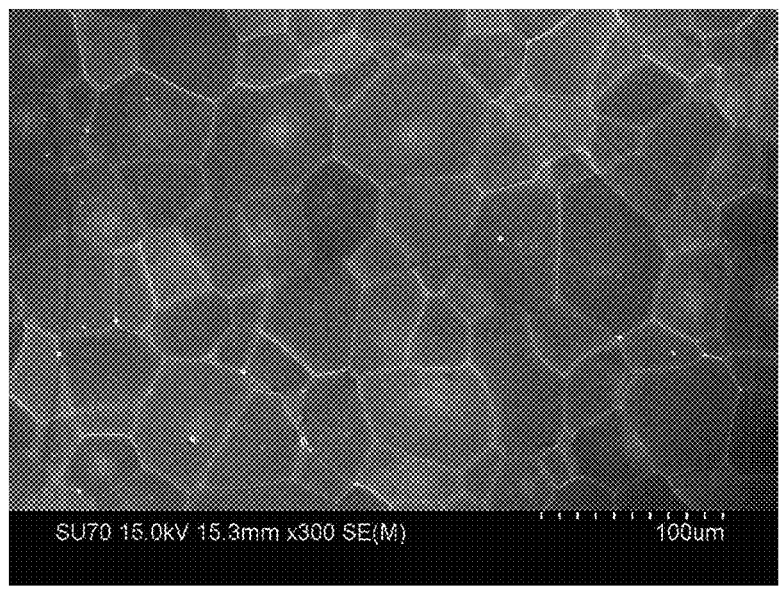
[Fig. 4]
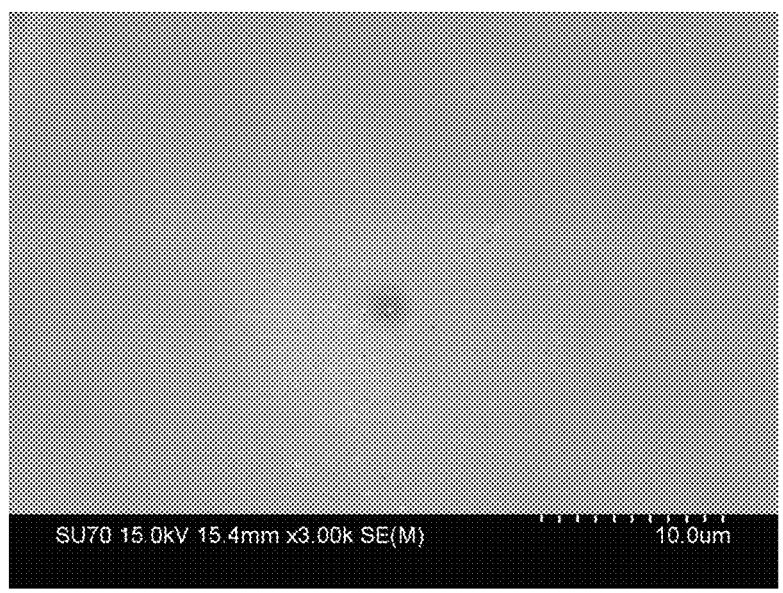

MAGNESIUM OXIDE SPUTTERING TARGET

BACKGROUND

The present invention relates to a magnesium oxide sputtering target suitable for the formation of a magnesium oxide (MgO) layer in a magnetic recording medium for use in a magnetic disk device or an electro device such as a tunnel magnetic resistance (TMR) element, and in particular relates to a magnesium oxide sputtering target with less generation of particles during sputtering.

Pursuant to the miniaturization and higher recording density of magnetic disks, the research and development of magnetic recording mediums are being conducted, and various improvements are being made to magnetic layers and foundation layers. Moreover, in the field of non-volatile memories, for instance, lower power consumption and miniaturization of a spin transfer torque magnetoresistive random access memory (MRAM) in comparison to conventional types of MRAM have been enabled by controlling the magnetization based on the spin of electrons flowing via a tunnel junction of the current flowing through the TMR element.

When magnesium oxide (MgO) is used for the tunnel junction part of the TMR element, since its characteristics will improve dramatically, the key is how to produce the MgO tunnel junction. As methods of producing a MgO film, there is a method of using a magnesium (Mg) target as the sputtering target and oxidizing the film after deposition, and there is a method of depositing a film using a magnesium oxide (MgO) target. It is said that the latter has a higher magnetic resistance effect and is able to exhibit superior characteristics.

Conventionally, the use of a MgO sintered body as a sputtering target is known. For example, Patent Document 1 discloses a MgO target suitable for the deposition of a MgO protective film based on the sputter method. According to this literature, it is described that the MgO target can be used at a sputter deposition rate of 1000 Å/min or more. Nevertheless, with this kind of conventional product, there were problems in that numerous particles were generated during sputtering, which consequently resulted in the considerable decrease in the yield of the product.

Moreover, Patent Document 2 discloses a MgO sintered body target in which numerous (111) planes are oriented. According to this literature, it is described that the mechanical property and the thermal conductivity of the target are favorable. Moreover, Patent Document 3 discloses a magnesium oxide sintered sputtering target having an average crystal grain size of 8 μm or less, and a peak intensity ratio I(111)/I(200) based on X-ray diffraction of 8% or higher and less than 25%. According to this literature, it is described that a sputtered film having superior insulation resistance and uniformity can be produced.

While a magnesium oxide sintered body can be produced by sintering a MgO powder and the production of such magnesium oxide sintered body is not difficult in itself, particles are easily generated with a sputtering target configured from a MgO sintered body. Nevertheless, the sintered bodies disclosed in the foregoing Patent Documents have a problem in that they are unable to sufficiently reduce particles. Particularly in recent years, demands against tolerable particles in the tunnel junction part, which is a key part of the TMR element, are becoming even stricter.

CITATION LIST

Patent Documents

[Patent Document 1] Japanese Unexamined Patent Application Publication No. H10-130827
[Patent Document 2] Japanese Unexamined Patent Application Publication No. 2009-173502
[Patent Document 3] International Publication No. 2013/065564

SUMMARY

An object of the present invention is to provide a sputtering target configured from a magnesium oxide sintered body in which the generation of particles during sputtering is less.

In order to achieve the foregoing object, the present application provides the following invention.

1) A sputtering target configured from a magnesium oxide sintered body, wherein a ratio of crystal grains of the magnesium oxide sintered body in which a number of pinholes in a single crystal grain is 20 or more is 50% or less.
2) The sputtering target according to 1) above, wherein a flexural strength is 150 MPa or more.
3) The sputtering target according to 1) or 2) above, wherein an average crystal grain size is 30 μm or more and 400 μm or less.
4) The sputtering target according to any one of 1) to 3) above, wherein a relative density is 99.7% or higher.

The sputtering target configured from a magnesium oxide sintered body of the present invention yields a superior effect of being able to suppress the generation of particles during sputtering. Consequently, for example, when forming a tunnel barrier (insulation layer) of the TMR element, the present invention yields a superior effect of being able to improve the device characteristics, as well as improve the yield.

BRIEF DESCRIPTION OF DRAWINGS

FIG. 1 is a scanning electron microscope (SEM) photo (magnification: 3000×) of a sputtering target in which pinholes locally exist within specific crystal grains.

FIG. 2 is a schematic diagram of the SEM photo of FIG. 1.

FIG. 3 is a SEM photo (magnification: 300×) showing the pinholes existing in the crystal grains of the sputtering target of Example 1.

FIG. 4 is a SEM photo (magnification: 3000×) showing the pinholes existing in the crystal grains of the sputtering target of Example 1.

DETAILED DESCRIPTION

A magnesium oxide sputtering target is normally produced based on hot press or other sintering methods, and, upon observing the crystal structure of the thus produced magnesium oxide sintered body, there were pinholes (minute pores having a diameter of roughly 1 μm) in the crystal grains. It is considered that, when these pinholes appear on the sputter surface, sputtering is preferentially performed from such pinholes and results in the increase in the generation of particles.

As a result of conducting further research, the pinholes do not exist in a manner of being uniformly dispersed in the crystal structure of the magnesium oxide, but rather many of the pinholes existed locally in certain crystal grains. And as the ratio of crystal grains in which many pinholes exist locally increases, the number of particles also tended to increase. Consequently, the present inventors discovered that the generation of particles can be suppressed if the ratio of crystal grains in which many pinholes exist locally can be decreased.

Based on the foregoing discovery, the sputtering target of the present invention is configured from a magnesium oxide sintered body, wherein a ratio of crystal grains of the magnesium oxide sintered body in which a number of pinholes in a single crystal grain is 20 or more is 50% or less, preferably 40% or less. With this kind of magnesium oxide sputtering target, it is possible to reduce the number of particles that are generated during sputtering.

Pinholes are pores having a diameter of roughly 1 μm which appear in the course of producing the magnesium oxide sintered body. FIG. 1 shows a scanning electron microscope (SEM) photo of the MgO sintered sputtering target, and FIG. 2 shows a replicated schematic diagram thereof (part where the pinholes are closely packed has been encircled). As shown in FIG. 2, the pinholes are not uniformly dispersed in the crystal structure, and numerous (20 or more) pinholes exist locally in certain crystal grains, and these crystal grains contribute to the generation of particles.

Here, the ratio of crystal grains in which the number of pinholes in a single crystal grain is 20 or more is calculated based on the following formula upon polishing the surface of the magnesium oxide sintered body (sputtering target), thereafter processing the sputtering target using an ion milling device, and observing a visual field in which roughly 100 crystal grains can be contained therein using a microscope.

(ratio of crystal grains in which the number of pinholes in a single crystal grain is 20 or more)=(number of crystal grains each containing 20 or more pinholes)/(total number of crystal grains within the visual field)×100

Note that the conditions of ion milling were as follows; namely, accelerating voltage of 4 kV, argon gas flow rate of 0.08 sccm, sample inclination of 20°, and processing time of 1 hour, and the ion milling device manufactured by Hitachi High-Technologies Corporation was used.

Moreover, with the sputtering target of the present invention, the average crystal grain size is preferably 30 μm or more and 400 μm or less. As the ratio of crystal grains in which many pinholes exist locally increases, the crystal grains tend to become refined and, therefore, the average crystal grain size is preferably 30 μm or more. Meanwhile, when the crystal grains are too large, the flexural strength will deteriorate and the effect of reducing particles will decrease and, therefore, the average crystal grain size is preferably 400 μm or less.

In the present disclosure, the average crystal grain size is measured and calculated according to the following method.

Foremost, the sputter surface (polished surface) of the sputtering target is observed using a laser microscope to obtain a structure photo. Next, straight lines are drawn on the structure photo, and the number of grain boundaries on those lines is counted. Then, with the length of the lines as L (μm) and the number of grain boundaries as n (grain boundaries), the crystal grain size d (μm) is calculated from d=L/n (section method). Here, the number of lines to be drawn on the photo are two lines each in equal intervals; two vertical lines (short direction of the photo shall be the vertical direction) and two horizontal lines (long direction of the photo shall be the horizontal direction), and, in a single photo (visual field), the average value of a total of four lines shall be the crystal grain size of one visual field. When the lengths of the photo are roughly the same, one length is used as the vertical direction and the other length is used as the horizontal direction.

Next, an operation that is similar to the above is performed for a total of five points; namely, one point in the center of the sputter surface of the sputtering target (disk shape), and, with a line connecting the center and the edge of the sputter surface as the radius, four points selected in 90° intervals with the center as a reference regarding the points on the circumference of a circle which is ½ of the foregoing radius, and the average value of these five points is defined as the average crystal grain size in the present invention. Note that the magnification is selected so that roughly 7 to 14 grain boundaries will be on one line in the vertical direction, and so that roughly 10 to 20 grain boundaries will be on one line in the horizontal direction. When the lengths of the photo are roughly the same, the magnification is selected so that roughly 7 to 20 grain boundaries will be on either of the lines.

With the sputtering target of the present invention, the flexural strength is preferably 150 MPa or more. When the flexural strength, which is an index of the strength of the sintered body (sputtering target), deteriorates, the effect of reducing particles will decrease. Accordingly, the flexural strength of the sputtering target of the present invention is preferably 150 MPa or more. In the present disclosure, the flexural strength is measured pursuant to JISR1601:2008.

With the sputtering target of the present invention, the relative density is preferably 99.7% or higher. As described above, by reducing the ratio of crystal grains containing many pinholes, the number of particles can be reduced, but by obtaining a dense sintered body, the effect of suppressing particles can be improved.

In the present disclosure, a sample is cut out from the sintered body to be used as the sputtering target, the apparent density of the sample is calculated based on the Archimedes method, and the value obtained by dividing the apparent density by the theoretical density (3.585 g/cm$^3$) and multiplying the result by 100 is defined as the relative density (%).

The magnesium oxide sputtering target (sintered body) according to the present invention can be produced according to the following method. Foremost, a MgO powder having an average grain size of 5 μm or less is prepared as the raw material. So as long as the average grain size of the MgO powder is within the foregoing range, a commercially available product may also be used. If the grain size of the raw material powder exceeds the foregoing range, the ratio of crystal grains in which many pinholes exist locally tends to increase due to the deterioration of sinterability, and this is undesirable. The purity of the raw material is preferably 99.99 wt % or higher. This is because the existence of impurities will considerably affect the deterioration in yield of the semiconductor device.

Next, the MgO powder is subject to uniaxial pressure sintering (hot press) in a vacuum under the following conditions; namely, maximum sintering temperature of 1400 to 1800° C., and load of 250 to 350 kg/cm$^2$. When the maximum sintering temperature is less than 1400° C., the ratio of crystal grains in which many pinholes exist locally tends to increase. Meanwhile, when the maximum sintering temperature exceeds 1800° C., the crystal grains tend to become coarsened due to grain growth, and this is undesirable. Moreover, when the load is less than 250 kg/cm$^2$, the ratio of crystal grains in which many pinholes exist locally tends to increase. Meanwhile, when the load exceeds 350 kg/cm², the crystal grains tend to become coarsened, and this is undesirable.

Moreover, the holding time at the maximum sintering temperature is preferably 3 to 6 hours. As a result of allowing sufficient time to pass after reaching the maximum temperature, the temperature distribution will decrease, sintering will advance uniformly, and the sintered state inside and outside the sintered body will become uniform. Moreover, in order to reduce the ratio of crystal grains in which many pinholes exist locally, it is also effective to perform HIP (hot isostatic pressing) treatment after hot press.

With regard to the sintering conditions, for instance, even when the respective sintering conditions are within the foregoing range, such as sintering temperature of 1400° C., holding time of 3 hours, and load of 250 kg/cm², there are cases where it is not possible to reduce the ratio of crystal grains in which many pinholes exist locally. Nevertheless, since the ratio of crystal grains in which many pinholes exist locally tends to decrease based on sintering performed at a high temperature and a high load and for long hours, the intended crystal grains can be obtained by suitably adjusting the foregoing conditions.

molded and sintered using a hot press device. The hot press conditions were a vacuum atmosphere and a maximum temperature of 1550° C., and the obtained product was pressed at 300 kg/cm². Moreover, the holding time was set to 6 hours. The thus obtained sintered body was processed into a target shape using a lathe.

The results of observing the sputter surface of the sputtering target with a scanning electron microscope (SEM) are shown in FIG. 3 and FIG. 4. The ratio of crystal grains in which a number of pinholes in a single crystal grain is 20 or more as shown in FIG. 3 and FIG. 4 was 38%. Moreover, the average crystal grain size was 60 μm and the flexural strength was 220 MPa. As a result of measuring the density of the target, the relative density was 99.9%.

Next, the target was mounted on a sputter device and sputtered to deposit a film on a silicon substrate. As a result of checking the number of particles having a size of 0.06 μm or larger on the thin film deposited on the silicon substrate using a particle counter, the result was sufficiently low at 30 particles or less.

The foregoing results are shown in Table 1.

TABLE 1

| | | Hot Press | | | | HIP | | Magnesium Oxide Sputtering Target | | | | Sputtered Film Particles (particles of 0.06 um or larger were counted) |
|---|---|---|---|---|---|---|---|---|---|---|---|---|
| | | Sintering | | | | | | Ratio of Crystal Grains with 20 or More Pinholes (%) | Average Crystal Grain Size (um) | Flexural Strength (MPa) | Relative Density (%) | |
| | | Temperature (° C.) | Load (kgf/cm²) | Time (h) | Temperature (° C.) | Pressure (kgf/cm²) | Time (h) | | | | | |
| Example | 1 | 1550 | 300 | 6 | — | — | — | 38 | 60 | 220 | 99.9 | ⊚ |
| Example | 2 | 1600 | 300 | 6 | — | — | — | 35 | 120 | 190 | 99.9 | ○ |
| Example | 3 | 1700 | 300 | 6 | — | — | — | 30 | 250 | 180 | 99.9 | ○ |
| Example | 4 | 1750 | 300 | 6 | — | — | — | 30 | 350 | 160 | 99.9 | ○ |
| Example | 5 | 1400 | 300 | 6 | — | — | — | 45 | 35 | 220 | 99.7 | ○ |
| Example | 6 | 1400 | 300 | 6 | 1400 | 1500 | 2 | 35 | 45 | 210 | 99.9 | ⊚ |
| Example | 7 | 1550 | 300 | 6 | 1800 | 1500 | 2 | 20 | 400 | 150 | 99.9 | ○ |
| Comparative Example | 1 | 1350 | 300 | 6 | — | — | — | 80 | 20 | 230 | 99.7 | X |
| Comparative Example | 2 | 1550 | 150 | 6 | — | — | — | 55 | 45 | 135 | 99.5 | X |

The thus obtained magnesium oxide sintered body is processed into the intended shape with a lathe or the like to obtain the sputtering target. The thus obtained magnesium oxide sputtering target can significantly suppress the generation of particles during sputtering.

EXAMPLES

The present invention is now explained with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

A MgO powder having an average grain size of 1 μm and a purity of 4N (99.99%) was prepared as the raw material powder. Next, 2400 g of the MgO powder was filled in a graphite die having an inner diameter of 206 mm, and then Example 2

A MgO powder having an average grain size of 1 μm and a purity of 4N (99.99%) was prepared as the raw material powder. Next, 2400 g of the MgO powder was filled in a graphite die having an inner diameter of 206 mm, and then molded and sintered using a hot press device. The hot press conditions were a vacuum atmosphere and a maximum temperature of 1600° C., and the obtained product was pressed at 300 kg/cm². Moreover, the holding time was set to 6 hours. The thus obtained sintered body was processed into a target shape using a lathe.

As a result of observing the sputter surface of the sputtering target with an SEM, the ratio of crystal grains in which a number of pinholes in a single crystal grain is 20 or more was 35%. Moreover, the average crystal grain size was 120 μm, and the flexural strength was 190 MPa. As a result of measuring the density of the target, the relative density was 99.9%.

Next, the target was mounted on a sputter device and sputtered to deposit a film on a silicon substrate. As a result of checking the number of particles having a size of 0.06 μm or larger on the thin film deposited on the silicon substrate using a particle counter, the result was low at 30 to 50 particles or less.

Example 3

A MgO powder having an average grain size of 1 μm and a purity of 4N (99.99%) was prepared as the raw material powder. Next, 2400 g of the MgO powder was filled in a graphite die having an inner diameter of 206 mm, and then molded and sintered using a hot press device. The hot press conditions were a vacuum atmosphere and a maximum temperature of 1700° C., and the obtained product was pressed at 300 kg/cm². Moreover, the holding time was set to 6 hours. The thus obtained sintered body was processed into a target shape using a lathe.

As a result of observing the sputter surface of the sputtering target with an SEM, the ratio of crystal grains in which a number of pinholes in a single crystal grain is 20 or more was 30%. Moreover, the average crystal grain size was 250 μm, and the flexural strength was 180 MPa. As a result of measuring the density of the target, the relative density was 99.9%.

Next, the target was mounted on a sputter device and sputtered to deposit a film on a silicon substrate. As a result of checking the number of particles having a size of 0.06 μm or larger on the thin film deposited on the silicon substrate using a particle counter, the result was low at 30 to 50 particles or less.

Example 4

A MgO powder having an average grain size of 1 μm and a purity of 4N (99.99%) was prepared as the raw material powder. Next, 2400 g of the MgO powder was filled in a graphite die having an inner diameter of 206 mm, and then molded and sintered using a hot press device. The hot press conditions were a vacuum atmosphere and a maximum temperature of 1750° C., and the obtained product was pressed at 300 kg/cm². Moreover, the holding time was set to 6 hours. The thus obtained sintered body was processed into a target shape using a lathe.

As a result of observing the sputter surface of the sputtering target with an SEM, the ratio of crystal grains in which a number of pinholes in a single crystal grain is 20 or more was 30%. Moreover, the average crystal grain size was 350 μm, and the flexural strength was 160 MPa. As a result of measuring the density of the target, the relative density was 99.9%.

Next, the target was mounted on a sputter device and sputtered to deposit a film on a silicon substrate. As a result of checking the number of particles having a size of 0.06 μm or larger on the thin film deposited on the silicon substrate using a particle counter, the result was low at 50 to 100 particles or less.

Example 5

A MgO powder having an average grain size of 1 μm and a purity of 4N (99.99%) was prepared as the raw material powder. Next, 2400 g of the MgO powder was filled in a graphite die having an inner diameter of 206 mm, and then molded and sintered using a hot press device. The hot press conditions were a vacuum atmosphere and a maximum temperature of 1400° C., and the obtained product was pressed at 300 kg/cm². Moreover, the holding time was set to 6 hours. The thus obtained sintered body was processed into a target shape using a lathe.

As a result of observing the sputter surface of the sputtering target with an SEM, the ratio of crystal grains in which a number of pinholes in a single crystal grain is 20 or more was 45%. Moreover, the average crystal grain size was 35 μm, and the flexural strength was 220 MPa. As a result of measuring the density of the target, the relative density was 99.7%.

Next, the target was mounted on a sputter device and sputtered to deposit a film on a silicon substrate. As a result of checking the number of particles having a size of 0.06 μm or larger on the thin film deposited on the silicon substrate using a particle counter, the result was low at 30 to 50 particles or less.

Example 6

A MgO powder having an average grain size of 1 μm and a purity of 4N (99.99%) was prepared as the raw material powder. Next, 2400 g of the MgO powder was filled in a graphite die having an inner diameter of 206 mm, and then molded and sintered using a hot press device. The hot press conditions were a vacuum atmosphere and a maximum temperature of 1400° C., and the obtained product was pressed at 300 kg/cm². Moreover, the holding time was set to 6 hours. The thus obtained sintered body was subject to HIP (hot isostatic pressing) treatment. The HIP treatment conditions were temperature of 1400° C., pressure of 1500 kgf/cm², and holding time of 2 hours.

The sintered body was thereafter processed into a target shape using a lathe.

As a result of observing the sputter surface of the sputtering target with an SEM, the ratio of crystal grains in which a number of pinholes in a single crystal grain is 20 or more was 35%. Moreover, the average crystal grain size was 45 μm, and the flexural strength was 210 MPa. As a result of measuring the density of the target, the relative density was 99.9%.

Next, the target was mounted on a sputter device and sputtered to deposit a film on a silicon substrate. As a result of checking the number of particles having a size of 0.06 μm or larger on the thin film deposited on the silicon substrate using a particle counter, the result was sufficiently low at 30 particles or less.

Example 7

A MgO powder having an average grain size of 1 μm and a purity of 4N (99.99%) was prepared as the raw material powder. Next, 2400 g of the MgO powder was filled in a graphite die having an inner diameter of 206 mm, and then molded and sintered using a hot press device. The hot press conditions were a vacuum atmosphere and a maximum temperature of 1550° C., and the obtained product was pressed at 300 kg/cm². Moreover, the holding time was set to 6 hours. The thus obtained sintered body was subject to HIP (hot isostatic pressing) treatment. The HIP treatment conditions were temperature of 1800° C., pressure of 1500 kgf/cm², and holding time of 2 hours.

The sintered body was thereafter processed into a target shape using a lathe.

As a result of observing the sputter surface of the sputtering target with an SEM, the ratio of crystal grains in which a number of pinholes in a single crystal grain is 20 or more was 20%. Moreover, the average crystal grain size was 400 µm, and the flexural strength was 150 MPa. As a result of measuring the density of the target, the relative density was 99.9%.

Next, the target was mounted on a sputter device and sputtered to deposit a film on a silicon substrate. As a result of checking the number of particles having a size of 0.06 µm or larger on the thin film deposited on the silicon substrate using a particle counter, the result was low at 30 to 50 particles or less.

Comparative Example 1

A MgO powder having an average grain size of 1 µm and a purity of 4N (99.99%) was prepared as the raw material powder. Next, 2400 g of the MgO powder was filled in a graphite die having an inner diameter of 206 mm, and then molded and sintered using a hot press device. The hot press conditions were a vacuum atmosphere and a maximum temperature of 1350° C., and the obtained product was pressed at 300 kg/cm$^2$. Moreover, the holding time was set to 6 hours. The thus obtained sintered body was processed into a target shape using a lathe.

As a result of observing the sputter surface of the sputtering target with an SEM, the ratio of crystal grains in which a number of pinholes in a single crystal grain is 20 or more was 80%. Moreover, the average crystal grain size was 25 µm, and the flexural strength was 230 MPa. As a result of measuring the density of the target, the relative density was 99.7%.

Next, the target was mounted on a sputter device and sputtered to deposit a film on a silicon substrate. As a result of checking the number of particles having a size of 0.06 µm or larger on the thin film deposited on the silicon substrate using a particle counter, the result was 100 particles or more.

Comparative Example 2

A MgO powder having an average grain size of 1 µm and a purity of 4N (99.99%) was prepared as the raw material powder. Next, 2400 g of the MgO powder was filled in a graphite die having an inner diameter of 206 mm, and then molded and sintered using a hot press device. The hot press conditions were a vacuum atmosphere and a maximum temperature of 1550° C., and the obtained product was pressed at 150 kg/cm$^2$. Moreover, the holding time was set to 6 hours. The thus obtained sintered body was processed into a target shape using a lathe.

As a result of observing the sputter surface of the sputtering target with an SEM, the ratio of crystal grains in which a number of pinholes in a single crystal grain is 20 or more was 55%. Moreover, the average crystal grain size was 45 µm, and the flexural strength was 135 MPa. As a result of measuring the density of the target, the relative density was 99.5%.

Next, the target was mounted on a sputter device and sputtered to deposit a film on a silicon substrate. As a result of checking the number of particles having a size of 0.06 µm or larger on the thin film deposited on the silicon substrate using a particle counter, the result was 100 particles or more.

The magnesium oxide (MgO) sputtering target of the present invention yields a superior effect of being able to suppress the generation of particles. The MgO sputtering target of the present invention is particularly effective as a tunnel film of a TMR element for use in a spinel-type MRAM.

The invention claimed is:

1. A sputtering target configured from a magnesium oxide sintered body, wherein a ratio of crystal grains of the magnesium oxide sintered body in which 20 or more pinholes are observed under a microscope is 20% or more and 50% or less; wherein the ratio of crystal grains of the magnesium oxide sintered body in which 20 or more pinholes are observed is calculated based on the following formula: (ratio of crystal grains in which 20 or more pinholes are observed)={(number of crystal grains in which 20 or more pinholes are observed in a visual field under the microscope)/(total number of crystal grains in the visual field)}×100; wherein the pinholes have a diameter of about 1 µm and exist within the crystal grains; and wherein an average crystal grain size of the sputtering target is 35 µm or more to 400 µm or less.

2. The sputtering target according to claim 1, wherein a flexural strength of the sputtering target is 150 MPa or more.

3. The sputtering target according to claim 1, wherein a relative density of the sputtering target is 99.7% or higher.

* * * * *